(12) United States Patent
Ricodeau

(10) Patent No.: US 11,069,599 B2
(45) Date of Patent: *Jul. 20, 2021

(54) RECESSED LEAD LEADFRAME PACKAGES

(71) Applicant: SEMICONDUCTOR COMPONENTS INDUSTRIES, LLC, Phoenix, AZ (US)

(72) Inventor: Francois Ricodeau, Phoenix, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 176 days.

This patent is subject to a terminal disclaimer.

(21) Appl. No.: 16/269,914

(22) Filed: Feb. 7, 2019

(65) Prior Publication Data

US 2019/0172774 A1 Jun. 6, 2019

Related U.S. Application Data

(60) Continuation of application No. 15/410,341, filed on Jan. 19, 2017, now Pat. No. 10,256,172, which is a division of application No. 14/800,881, filed on Jul. 16, 2015, now Pat. No. 9,583,421.

(51) Int. Cl.
*H01L 23/495* (2006.01)
*H01L 23/00* (2006.01)

(52) U.S. Cl.
CPC .... *H01L 23/4951* (2013.01); *H01L 23/49513* (2013.01); *H01L 23/49541* (2013.01); *H01L 23/49548* (2013.01); *H01L 24/32* (2013.01); *H01L 24/48* (2013.01); *H01L 24/49* (2013.01); *H01L 2224/05554* (2013.01); *H01L 2224/0603* (2013.01); *H01L 2224/32245* (2013.01); *H01L 2224/48245* (2013.01); *H01L 2224/48247* (2013.01); *H01L 2224/49113* (2013.01); *H01L 2224/49171* (2013.01); *H01L 2924/00014* (2013.01)

(58) Field of Classification Search
None
See application file for complete search history.

(56) References Cited

U.S. PATENT DOCUMENTS

| | | | | |
|---|---|---|---|---|
| 6,005,287 | A | * | 12/1999 | Kaiya ............ H01L 23/49562 257/666 |
| 6,475,834 | B2 | | 11/2002 | Embong et al. |
| 6,664,614 | B2 | * | 12/2003 | Kim ............... H01L 23/49555 257/666 |
| 7,901,990 | B2 | | 3/2011 | Letterman, Jr. et al. |
| 7,939,380 | B2 | | 5/2011 | Krishnan et al. |
| 8,105,883 | B2 | | 1/2012 | Yoshiba et al. |
| 8,759,978 | B2 | | 6/2014 | Prajuckamol et al. |
| 8,796,830 | B1 | | 8/2014 | Fjelstad |

(Continued)

*Primary Examiner* — Mounir S Amer
(74) *Attorney, Agent, or Firm* — Adam R. Stephenson, LTD.

(57) ABSTRACT

Leadframes for semiconductor packages. Implementations may include a plurality of leads extending inwardly into an opening surrounded by the plurality of leads where the plurality of leads except for at least one are configured to mechanically couple at a surface of a semiconductor chip. The at least one of the plurality of leads that is not configured to mechanically coupled at the surface of the semiconductor chip be configured to electrically couple with the semiconductor chip.

20 Claims, 3 Drawing Sheets

(56) References Cited

U.S. PATENT DOCUMENTS

| | | |
|---|---|---|
| 2002/0030658 A1 | 3/2002 | Kim et al. |
| 2002/0163078 A1 | 11/2002 | Chai et al. |
| 2007/0040247 A1 | 2/2007 | Lee et al. |
| 2008/0157301 A1 | 7/2008 | Ramakrishna et al. |
| 2010/0219517 A1 | 9/2010 | Yoshiba et al. |
| 2015/0162270 A1 | 6/2015 | Ashrafzadeh et al. |
| 2015/0348891 A1 | 12/2015 | Talledo |

* cited by examiner

RECESSED LEAD LEADFRAME PACKAGES

CROSS REFERENCE TO RELATED APPLICATIONS

This application is a continuation application of the earlier U.S. Utility patent application to Ricodeau entitled "Recessed Lead Leadframe Packages," application Ser. No. 15/410,341, filed Jan. 19, 2017, which application is a divisional application of the earlier U.S. Utility patent application to Ricodeau entitled "Recessed Lead Leadframe Packages," application Ser. No. 14/800,881, filed Jul. 16, 2015, now issued as U.S. Pat. No. 9,583,421, the disclosures of each of which are hereby incorporated entirely herein by reference.

BACKGROUND

1. Technical Field

Aspects of this document relate generally to leadframes, such as structures and devices used in packaging semiconductor chips.

2. Background Art

Leadframes are used to make electrical connections between a silicon die of semiconductor package and an electronic circuit board or printed circuit board (PCB). Various leadframes include leads that are mechanical structures that extend through a mold material or other packaging material/structure enclosing the semiconductor chip that connect electrical pads or connectors on the semiconductor die with corresponding electrical pads or connectors on the electrical circuit board. For various package types, the leadframe supports the die during wire bonding and during molding of package/mold compound around the die.

SUMMARY

Implementations of leadframes may include: a plurality of leads extending inwardly into an opening surrounded by the plurality of leads where the plurality of leads except for at least one are configured to mechanically couple at a surface of a semiconductor chip. The at least one of the plurality of leads that is not configured to mechanically coupled at the surface of the semiconductor chip may include a thinned portion adjacent to the semiconductor chip (thinned lead) and may be configured to electrically coupled with the semiconductor chip.

Implementations of leadframes may include one, all, or any of the following:

The thinned portion of the thinned lead may be half etched.

The thinned lead may be configured to carry a high voltage signal to the semiconductor chip.

The plurality of leads may be configured to mechanically support the semiconductor chip through coupling at the surface of the semiconductor chip through a die bonding material.

The thinned lead may not be mechanically coupled at the surface of the semiconductor chip through the die bonding material.

The plurality of leads may be configured to couple with an electronic circuit board at a surface of each of the plurality of leads opposite the surface of the semiconductor chip.

A perimeter of the surface of each of the plurality of leads opposite the surface of the semiconductor chip may be smaller than a perimeter of a surface of each of the plurality of leads that is configured to be coupled at the surface of the semiconductor chip.

The surface of each of the plurality of leads except for the thinned lead opposite the surface of the semiconductor chip may be half etched.

Implementations of a chip-on-lead package may include a leadframe coupled to a semiconductor chip where the leadframe includes a plurality of leads extending inwardly into an opening surrounded by the plurality of leads. At least one of the plurality of leads may include a thinned portion adjacent to the semiconductor chip (thinned lead). The thinned lead may electrically couple with a high voltage connector of the semiconductor chip. The plurality of leads, except for the thinned lead, may mechanically couple to the semiconductor chip through a die bonding material.

Implementations of a chip-on-lead package may include one, all, or any of the following:

The thinned portion of the thinned lead may be half etched.

The plurality of leads may be configured to couple with an electronic circuit board at a surface of each of the plurality of leads opposite the surface of the semiconductor chip.

A perimeter of the surface of each of the plurality of leads opposite the surface of the semiconductor chip except for the thinned lead may be smaller than a perimeter of a surface of each of the plurality of leads configured to be coupled at the surface of the semiconductor chip.

The surface of each of the plurality of leads except for the thinned lead opposite the surface of the semiconductor chip may be half etched.

Implementations of a chip-on-lead package may include a leadframe coupled to a semiconductor chip where the leadframe includes a plurality of leads extending inwardly into an opening surrounded by the plurality of leads. At least one of the plurality of leads may electrically couple with a high voltage connector of the semiconductor chip and does not mechanically couple at a surface of the semiconductor chip through a die bonding material.

Implementations of chip-on-lead packages may include one, all, or any of the following:

The at least one of the plurality of leads that electrically couples with the high voltage connector may include a thinned portion.

The thinned portion may be half etched.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended leadframes will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such leadframes, and implementing components and methods, consistent with the intended operation and methods.

Figure 1:
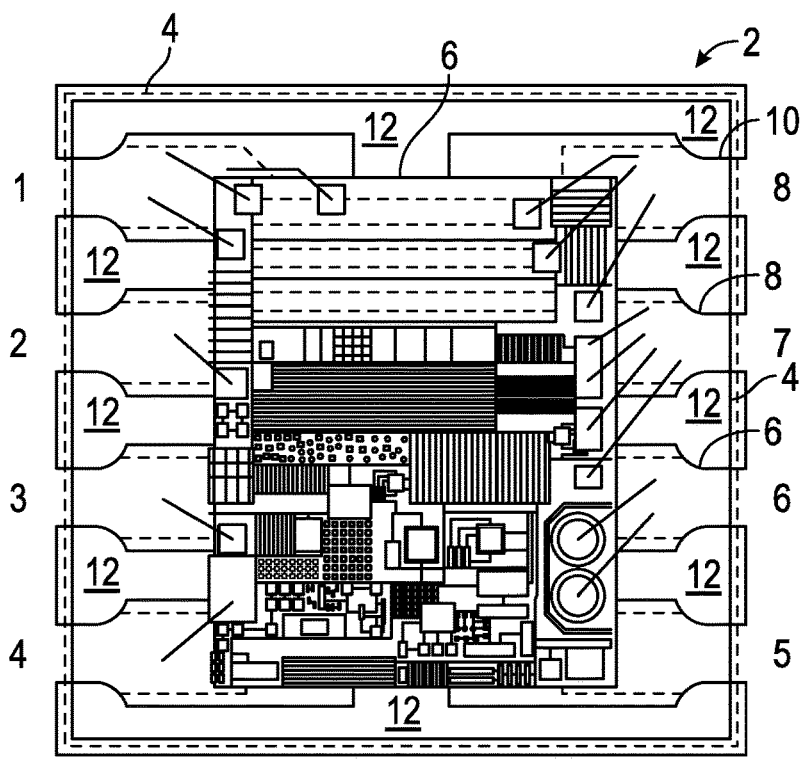
FIG. 1 is a top view of a conventional chip-on-lead package with mold compound surrounding the leads in see-through and with lead numbers included.

Referring to FIG. 1, an implementation of a conventional chip-on-lead package 2 is illustrated with the mold compound 4 surrounding the chip (silicon die) 6 (active side up) shown in dotted lines. As illustrated, the conventional chip-on-lead package includes a plurality of leads 6, 8, 10 that extend into opening 12 and underneath (below) chip 6. As illustrated by the dotted lines on the plurality of leads 6, 8, 10 the surfaces of the leads that oppose, or are on the other side from, the chip 6 may be half etched to reduce their perimeter and size to the shape formed by the dotted lines. In this way, after packaging, the only part of the leads 6, 8, 10 that is exposed through the mold compound 4 is the perimeter of the shape of each lead represented in dotted lines. This serves to reduce the exposed lead size and conserve space on the circuit board to which the package 2 is coupled under the package 2. As can be observed, in the conventional package 2, each lead (pin) extends below (underneath) the chip 6 when viewed from the top, mechanically supports the chip 6, and is mechanically coupled at the bottom surface of the chip (non-active side of the chip in various implementations).

Figure 3:
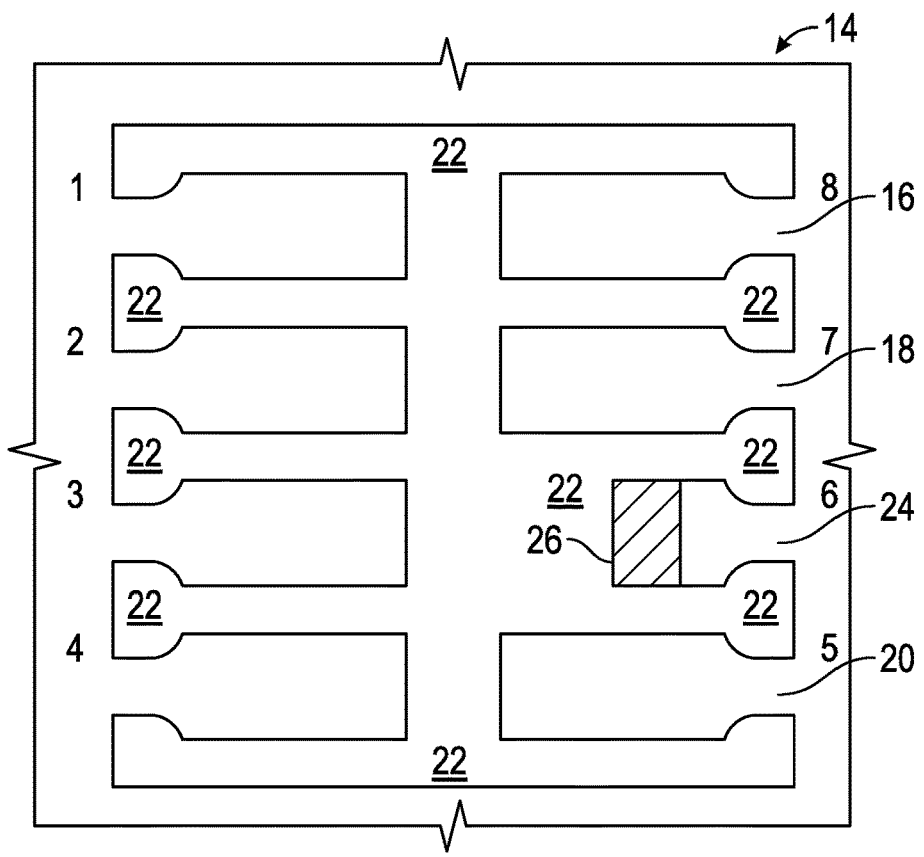
FIG. 3 is a top view of a second leadframe implementation.

Referring to FIG. 3, an implementation (second implementation) of a leadframe 14 is illustrated. As illustrated, the leadframe 14 includes a plurality of leads (pins 1-8), 16, 18, 20 which extend inwardly into opening 22. As indicated by the continuation lines on all four sides of the leadframe 14, the material of the leadframe 14 continues out of the view of the picture during manufacturing and prior to trimming and separating of the leads from the rest of the leadframe 14 at the conclusion of the package manufacturing process during package singulation. As illustrated in FIG. 3, one of the leads 24 does not extend into the opening 22 as far as the other leads (is shorter in length than the rest). Furthermore, the lead 24 contains a thinned portion 26, which has a thinner material thickness than the rest of the lead 24. In particular implementations the thinned portion 26 may be half etched, or be substantially half of the thickness of the rest of the lead 24. In other implementations, where etching is not used to manufacture the lead 24, it may be thinned using other techniques, such as, by non-limiting example, molding, casting, cutting, and any other technique used to create a thinned portion 26 on the lead 24.

Figure 2:
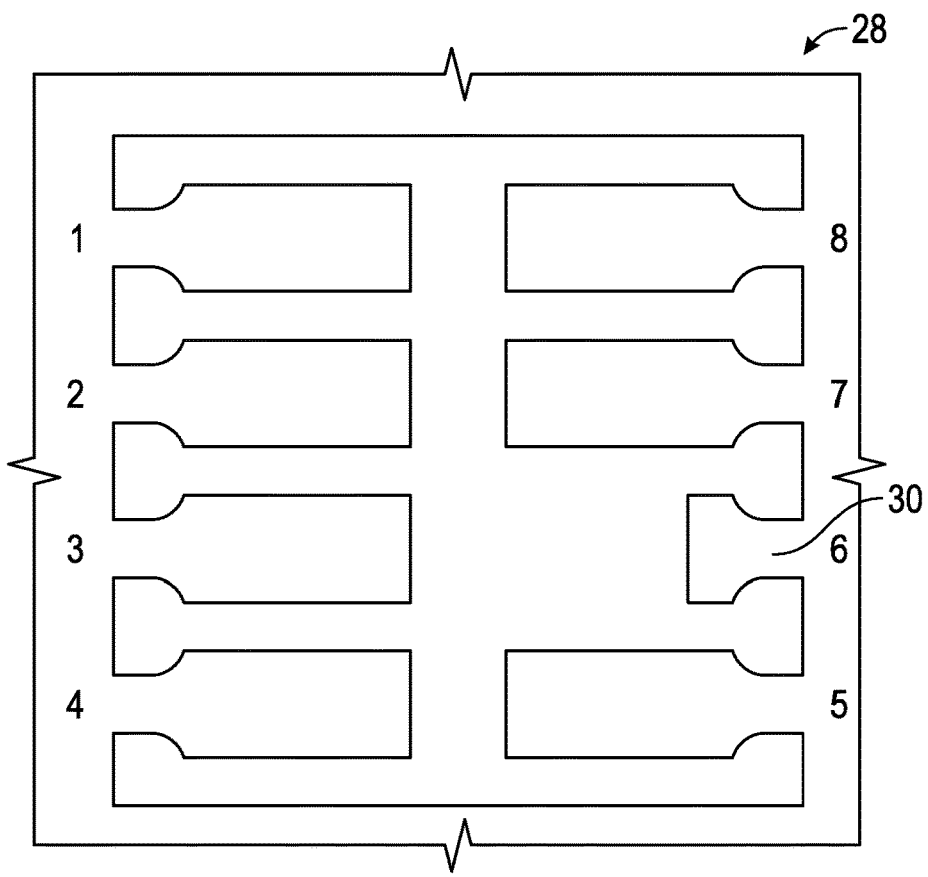
FIG. 2 is a top view of a first leadframe implementation.

In various implementations, the lead 24 may be fully or partially thinned along its length. Referring to FIG. 2, which is another implementation (first implementation) of a leadframe 28, the lead 30 may not include a thinned portion at all, but may be shorter in length than the lead 24 of the leadframe 14 illustrated in FIG. 3. Such an implementation may be manufactured through, by non-limiting example, fully etching, stamping, laser cutting, or otherwise singulating the lead 30. The reasons for this will be discussed hereafter.

Figure 4:
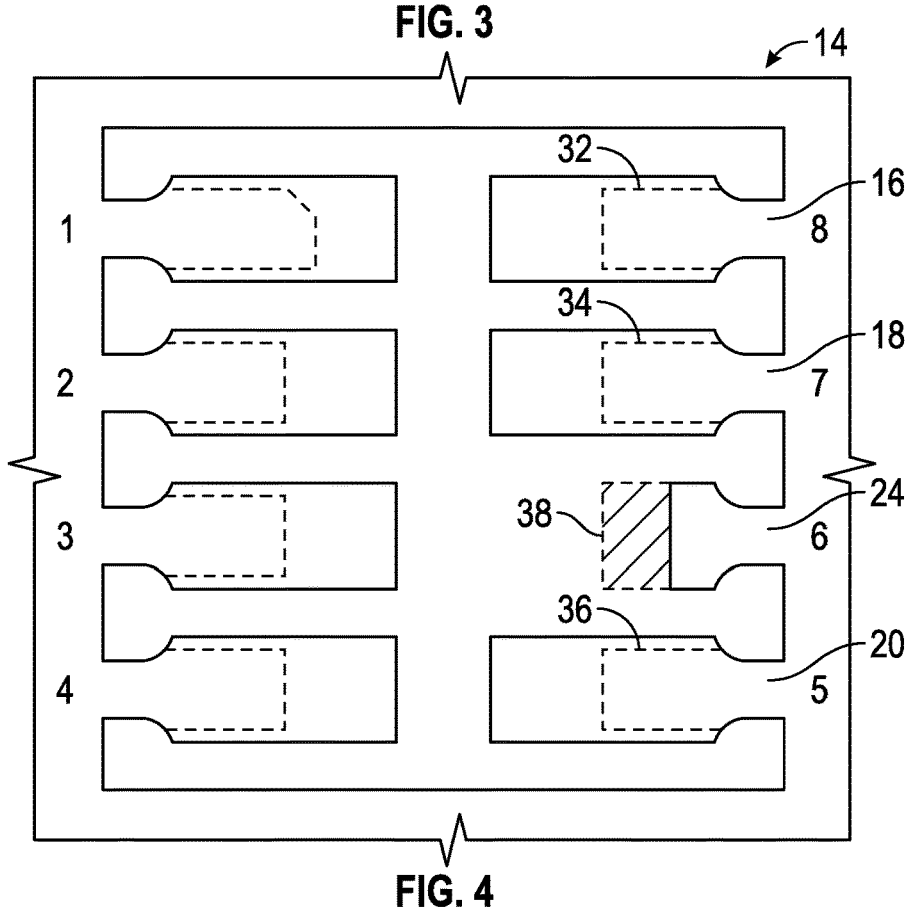
FIG. 4 is a top see-through view of the second leadframe implementation of FIG. 3 showing the outline of the lead surfaces that contact the circuit board.

Referring to FIG. 4, the outlines of the exposed surfaces 32, 34, 36 of the leads 16, 18, 20 are illustrated. These exposed surfaces 32, 34, 36 represent the shape of the leads 16, 18, 20 as they appear on the bottom surface of the package once the mold compound has be applied to the leadframe 14. As can be noted, the exposed surfaces 32, 34, 36 each have a perimeter bounded by the dotted line regions that merge with the solid line portions of each lead. These surfaces are smaller than the upper surface of each of the leads. In various implementations these may be created by half etching the exposed surfaces during manufacturing of the leadframe. In various implementations, particularly where the lead 24 is a thinned lead, the perimeter of the exposed surface 38 of the lead 24 may be same in shape as one or more of the other leads 16, 18, 20. This means that to the outside observer, in various implementations, once the molding compound has been applied, the fact that the lead 24 is shorter than the other leads 16, 18, 20 is not visually apparent to the user. This also means that in various implementations, the exposed surface 38 of the lead 24 may not be half etched as the rest of the lead are. In such implementations, no changes to PCB layouts may be required, because the bottom side of lead 24 has the same dimensions and position as the rest of the leads (except for lead 1, which has different dimensions for the purpose of identifying this pin during assembly with the PCB). In other implementations, however, where the lead 24 does not have the same shape and/or position as the rest of the leads a custom/altered PCB layout could be used to accommodate it.

As illustrated in FIG. 2, however, in other implementations where the lead 30 is shorter than the size of the exposed surface 32, 34, 36 of the other leads illustrated in FIG. 1, the user will be able to visually see that the lead 30 has a different exposed perimeter and shape. In other implementations, however, the leads 24, 30, whether thinned or not, may also have a larger exposed surface than the other leads.

Figure 5:
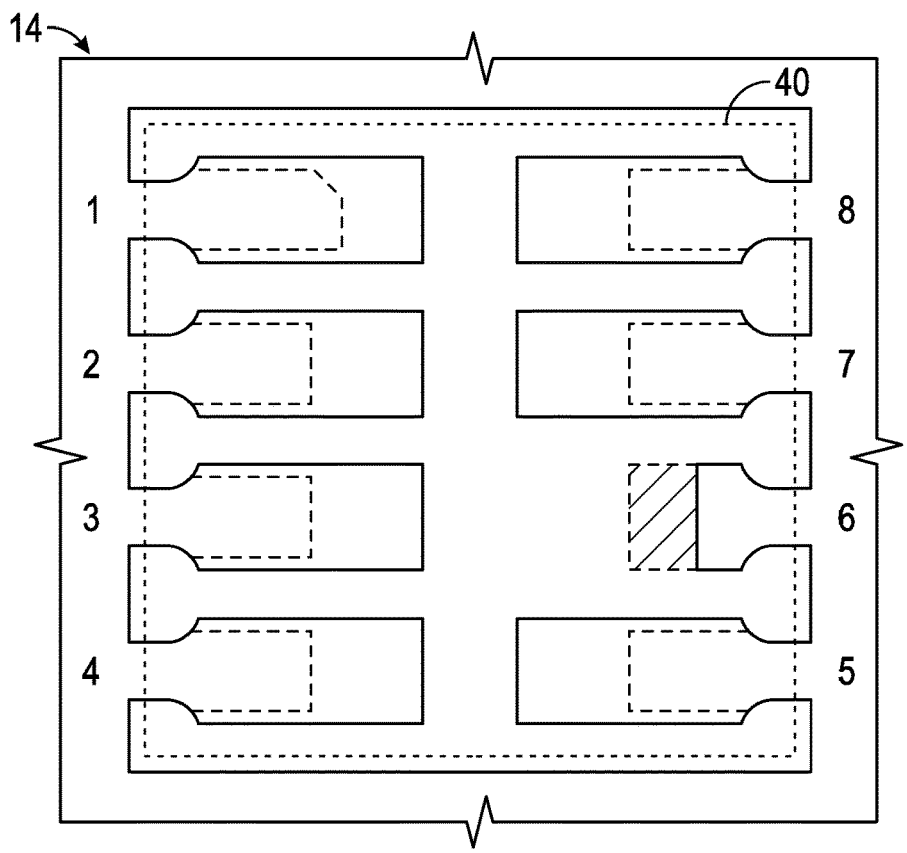
FIG. 5 is a top see-through view of the leadframe implementation of FIG. 4 showing the outline of the finished package in dotted lines relative to the leads.

Referring to FIG. 5, the outline of the mold compound 40 over the leadframe 14 is illustrated, showing how the end of each lead will be flush with or slightly recessed within the outline of the mold compound 40 after each package has been separated from the set of concurrently manufactured leadframes during processing.

Figure 6:
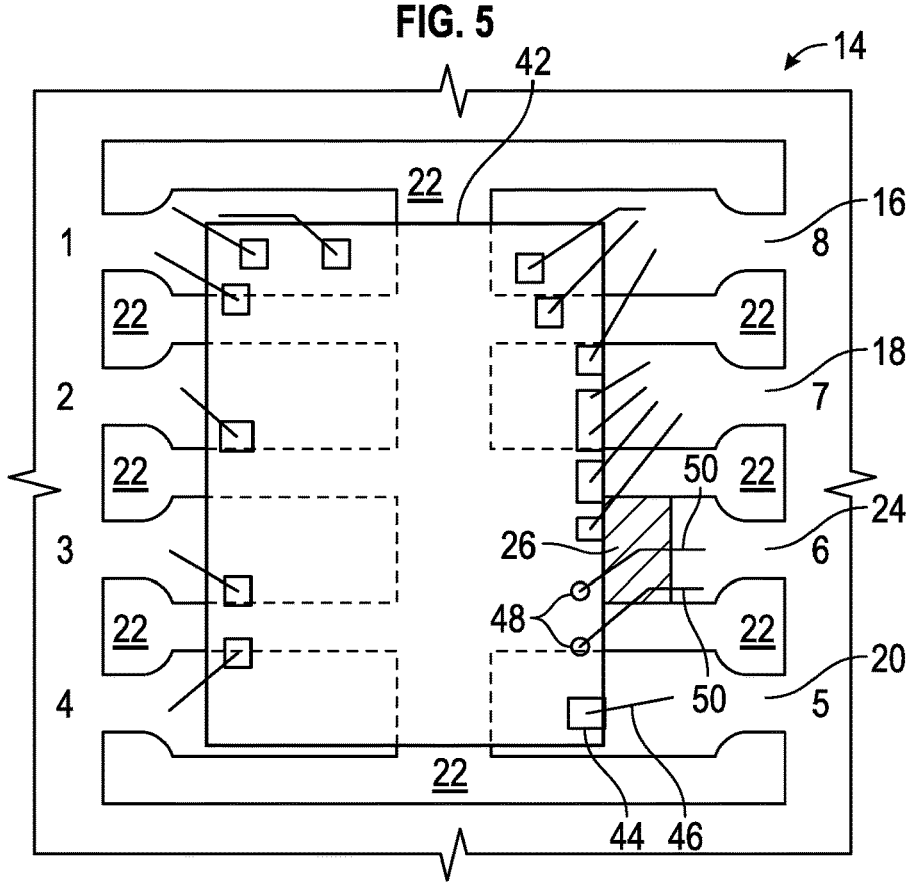
FIG. 6 is a top see-through view of the leadframe implementation of FIG. 4 showing the location of the chip and wire bonds coupling the chip connections to the individual leads with the outline of the leads below the chip showing how the chip is supported mechanically by the leads.

Referring to FIG. 6, a semiconductor chip (die) 42 is shown coupled with the leadframe 14. The coupling of the chip 42 with the leadframe 14 takes place through a die bonding material (not shown) that is placed between the plurality of leads 16, 18, 20 and the surface of the chip 42 that faces the plurality of leads (back surface). Also illustrated are various connectors/pad regions 44 on the chip 42 and wire bonds 46 that electrically couple the connectors 44 with the corresponding lead 20. The outlines of the plurality of leads 16, 18, 20 that extend under the chip 42 are illustrated in FIG. 6 in dotted lines.

It has been discovered that for a chip 42 that utilizes high voltage, the high voltage connectors 48 that are coupled to lead 24 are prone to premature failure over time as demonstrated during heated reliability package testing such as the High Temperature Operating Life (HTOL) reliability test. In various implementations, the die bonding material is made of an epoxy material applied to the wafer containing the various chips before the chips are diced. In this way, the die bonding material is spread over the entire back surface of the die. In conventional chip-on-lead packages like the one illustrated in FIG. 1, since all of the plurality of leads 6, 8, 10 extend beneath the chip 42 and are mechanically coupled at the back surface of the chip 42 through the die bonding material, those leads that handle high voltage relative to other leads in the package (for example, in the range of about 100 V and higher) are subject to failures and become a package reliability risk. Without being bound by any theory, it appears that over time the high voltage isolation between lead and chip will fail, as demonstrated during HTOL reliability testing as small air bubbles and small metal pieces in the chip bonding material create a conduction or breakdown path and cause the bonding material to fail to isolate the applied high voltage over an extended period of time.

By inspection in FIG. 6 it is apparent that the lead 24 does not extend beneath the chip 42 and also, because of the presence of the thinned portion 26, does not physically contact or become very close (relatively speaking) to physically contacting the back surface of the chip 42 (in comparison to the other leads). Because of this, there is no die bonding material mechanically coupling the lead 24 at the back surface of chip 42. As a result, the only mechanical coupling of the lead 24 with the chip 42 occurs through the mold compound which bridges the gap between the lead 24 and the chip 42 during the molding process. Since the mold compound bridging the gap has a much higher voltage isolation property than chip bonding materials that include epoxy, they generally demonstrate much better long term reliability in the presence of high voltage. Furthermore, the distance of the gap between the lead 24 and the chip 42 is much larger than the about 10 to about 50 micron thick layer of chip bonding material (in various implementations) separating a lead bonded directly to the chip.

Because the lead 24 is not mechanically coupled at the back surface of the chip 42 through a die bonding material, and, indeed, is not located in relatively close proximity to the back surface of the chip 42, it can be used to carry high voltage signals between the chip 42 and the lead 24. This is because the lack of mechanical coupling and proximity to the back surface of the chip 42 prevents the negative effects from heating from affecting a bond between the lead and the chip 42, as there is no direct bond. Accordingly, the wire bonds handling high voltage signals 50, bonded to the non-thinned section of the lead 24, allow the lead 24 to handle high voltage signals without being affected by issues caused by failure of the bond between the lead 24 and the chip 42. In various implementations, because the lead 24 is not directly mechanically coupled to the chip 42 through a die bonding material, the characteristics of the mold compound used may be sufficient to prevent any wire bond failures due to heating effects of the lead 24 during high voltage operation.

While the lead 24 does not directly act to mechanically support the chip 42, the remaining plurality of leads 16, 18, 20 may be more than sufficient to provide mechanical support. While in the figures a single lead has been illustrated as having a shorter length and/or thinned portion, more than one lead could be utilized that have either the same, a similar, or different lengths which are shorter than the rest of the plurality of leads. A wide variety of materials could be used for the leads and leadframe including, by non-limiting example, copper, aluminum, silver, various alloys, any combination of the same, and any other electrically conductive material.

In places where the description above refers to particular implementations of leadframes and implementing components, sub-components, methods and sub-methods, it should be readily apparent that a number of modifications may be made without departing from the spirit thereof and that these implementations, implementing components, sub-components, methods and sub-methods may be applied to other leadframes.

What is claimed is:

1. A chip-on-lead package comprising:
   a leadframe coupled to a semiconductor chip, the leadframe comprising a plurality of leads extending inwardly into an opening in the leadframe surrounded by the plurality of leads;
   wherein at least one of the plurality of leads comprises a thinned portion adjacent to the semiconductor chip and is an at least one thinned lead; and
   wherein the plurality of leads, except for the at least one thinned lead, mechanically couple to the semiconductor chip through a die bonding material.

2. The package of claim 1, wherein the at least one thinned lead is configured to carry up to 200 volts.

3. The package of claim 1, wherein the thinned portion of the at least one thinned lead is one of half etched and fully etched.

4. The package of claim 1, wherein the plurality of leads is configured to couple with an electronic circuit board at a surface of each of the plurality of leads opposite the surface of the semiconductor chip.

5. The package of claim 1, wherein the at least one thinned lead does not extend inwardly into the opening as far as the other leads of the plurality of leads.

6. The package of claim 1, wherein the plurality of leads is configured to mechanically support the semiconductor chip through coupling at a surface of the semiconductor chip through a die bonding material.

7. The package of claim 1, wherein a first perimeter of a first surface of each of the plurality of leads opposite a surface of the semiconductor chip except for the at least one thinned lead is smaller than a second perimeter of a second surface of each of the plurality of leads configured to be coupled at the surface of the semiconductor chip.

8. The package of claim 7, wherein the surface of each of the plurality of leads except for the at least one thinned lead opposite the surface of the semiconductor chip is half etched.

9. A chip-on-lead package comprising:
   a leadframe coupled to a semiconductor chip, the leadframe comprising a plurality of leads extending inwardly into an opening in the leadframe surrounded by the plurality of leads;
   wherein at least one lead electrically couples with a high voltage connector of the semiconductor chip; and
   wherein the plurality of leads, except for the at least one lead, mechanically couple to the semiconductor chip through a die bonding material.

10. The package of claim 9, wherein the at least one lead is configured to carry up to 200 volts.

11. The package of claim 9, wherein the at least one lead is one of half etched and fully etched.

12. The package of claim 9, wherein the plurality of leads is configured to couple with an electronic circuit board at a surface of each of the plurality of leads opposite the surface of the semiconductor chip.

13. The package of claim 9, wherein the at least one lead does not extend inwardly into the opening as far as the other leads of the plurality of leads.

14. The package of claim 9, wherein the plurality of leads is configured to mechanically support the semiconductor chip through coupling at a surface of the semiconductor chip through a die bonding material.

15. The package of claim 9, wherein a first perimeter of a first surface of each of the plurality of leads opposite a surface of the semiconductor chip except for the at least one lead is smaller than a second perimeter of a second surface of each of the plurality of leads configured to be coupled at the surface of the semiconductor chip.

16. The package of claim 15, wherein the surface of each of the plurality of leads except for the at least one lead opposite the surface of the semiconductor chip is half etched.

17. A chip-on-lead package comprising:
a leadframe coupled to a semiconductor chip, the leadframe comprising a plurality of leads extending inwardly into an opening in the leadframe surrounded by the plurality of leads;
wherein at least one of the plurality of leads comprises a thinned portion and is an at least one thinned lead.

18. The package of claim 17, wherein the at least one thinned lead is configured to carry up to 200 volts.

19. The package of claim 17, wherein the thinned portion of the at least one thinned lead is one of half etched and fully etched.

20. The package of claim 17, wherein the plurality of leads is configured to couple with an electronic circuit board at a surface of each of the plurality of leads opposite a surface of the semiconductor chip.

* * * * *